(12) United States Patent
Lischer et al.

(10) Patent No.: US 8,003,956 B2
(45) Date of Patent: Aug. 23, 2011

(54) METHOD AND APPARATUS FOR CONTROLLING BEAM CURRENT UNIFORMITY IN AN ION IMPLANTER

(75) Inventors: D. Jeffrey Lischer, Acton, MA (US); John (Bon-Woong) Koo, Andover, MA (US); Peter F. Kurunczi, Cambridge, MA (US); Shardul Patel, Woburn, MA (US); Wilhelm P. Platow, Somerville, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 459 days.

(21) Appl. No.: 12/244,978

(22) Filed: Oct. 3, 2008

(65) Prior Publication Data

US 2010/0084582 A1 Apr. 8, 2010

(51) Int. Cl.
*G21K 5/10* (2006.01)
(52) U.S. Cl. ............ 250/492.21; 250/492.1; 250/492.2; 250/492.3
(58) Field of Classification Search .................. None
See application file for complete search history.

(56) References Cited

U.S. PATENT DOCUMENTS

| | | | | |
|---|---|---|---|---|
| 4,507,555 A | * | 3/1985 | Chang | 250/281 |
| 4,825,087 A | * | 4/1989 | Renau et al. | 250/492.2 |
| 5,481,116 A | * | 1/1996 | Glavish et al. | 250/396 ML |
| 5,633,506 A | * | 5/1997 | Blake | 250/492.21 |
| 5,814,819 A | * | 9/1998 | Sinclair et al. | 250/492.21 |
| 6,720,116 B1 | * | 4/2004 | Tzu et al. | 430/5 |
| 2002/0130277 A1 | * | 9/2002 | Halling | 250/492.21 |
| 2006/0108543 A1 | * | 5/2006 | Chang et al. | 250/492.21 |
| 2006/0169911 A1 | * | 8/2006 | Renau et al. | 250/396 ML |
| 2008/0245957 A1 | * | 10/2008 | Gupta et al. | 250/252.1 |
| 2009/0206270 A1 | * | 8/2009 | Glayish et al. | 250/396 ML |
| 2009/0261248 A1 | * | 10/2009 | Glavish et al. | 250/298 |
| 2010/0129564 A1 | * | 5/2010 | Shembel et al. | 427/534 |

FOREIGN PATENT DOCUMENTS

EP 291279 A1 * 11/1988
RU 1625256 A1 * 12/1993

* cited by examiner

*Primary Examiner* — Robert Kim
*Assistant Examiner* — Andrew Smyth

(57) ABSTRACT

An ion implantation system for neutralizing the space charge effect associated with a high current low energy ion beam. The implantation system includes an ion source configured to receive a dopant gas and generate ions having a particular energy and mass from which ions are extracted through an aperture. A work piece positioned downstream of the ion source for receiving the extracted ions in the form of an ion beam. A bleed gas channel disposed between the ion source and the work piece. The bleed gas channel supplying a gas used to neutralize the space charge effect associated with the ion beam.

18 Claims, 8 Drawing Sheets

METHOD AND APPARATUS FOR CONTROLLING BEAM CURRENT UNIFORMITY IN AN ION IMPLANTER

BACKGROUND OF THE INVENTION

1. Field of the Invention

Embodiments of the invention relate to the field of ion implantation. More particularly, the present invention relates to an apparatus and method for controlling beam current uniformity for low energy beam transport in an ion implanter.

2. Discussion of Related Art

Ion implantation is a process used to dope ions into a work piece. One type of ion implantation is used to implant impurity ions during the manufacture of semiconductor substrates to obtain desired electrical device characteristics. Typically, arsenic or phosphorus may be doped to form n-type regions in the substrate and boron, gallium or indium are doped to create p-type regions in the substrate. An ion implanter used for this purpose generally includes an ion source chamber which generates ions of a particular species, a series of beam line components to control the ion beam and a platen to secure the wafer that receives the ion beam. These components are housed in a vacuum environment to prevent contamination and dispersion of the ion beam. The beam line components may include a series of electrodes to extract the ions from the source chamber, a mass analyzer configured with a particular magnetic field such that only the ions with a desired mass-to-charge ratio are able to travel through the analyzer, and a corrector or collimator magnet to provide a ribbon beam which is orthogonally directed to a substrate with respect to the ion beam to implant the ions into the crystal lattice. The ions lose energy when they collide with electrons and nuclei in the substrate and come to rest at a desired depth within the substrate based on the acceleration energy.

The depth of ion implantation into the substrate is based on the ion implant energy and ion mass. Smaller electronic device sizes require high beam current densities implanted at low energy levels (for example $\leq 2$ keV). Typically, low energy ion beams diverge as they travel through an ion implanter because of beam "blow-up" which is due to space charge effect. Space charge effect is where positively charged ions in the beam repel each other causing the beam to diverge from the beam line path. One way to neutralize this space charge effect is to introduce a plasma into the beam path such that the number of positively and negatively charged particles within the beam space are the same. This may be accomplished by introducing a neutral gas into the beam line so that beam-plasma can be generated via beam-potential interaction with the neutral gas. The extent of space charge neutralization may be controlled by the introduction and composition of the particular type of the neutral gas into the beam line. For example, one method positions a nozzle near the extraction region and injects water vapor to the beam to counteract the space charge effect for neutralizing boron ion beams. However, this method may not sufficiently improve the ion beam uniformity.

SUMMARY OF THE INVENTION

Exemplary embodiments of the present invention are directed to a differential gas bleed method and apparatus. In an exemplary embodiment, an ion implantation system includes an ion source configured to receive a dopant gas and generate ions having a particular energy and mass. The ion source has an aperture through which the ions are extracted and formed into an ion beam. A work piece is positioned downstream from the ion source and receives the ion beam. A bleed gas channel is disposed between the ion source and the work piece and supplies a gas used to neutralize a space charge effect associated with the ion beam. The bleed gas channel has a plurality of holes for distributing the bleed gas across at least a portion of the ion beam.

DESCRIPTION OF EMBODIMENTS

Figure 1:
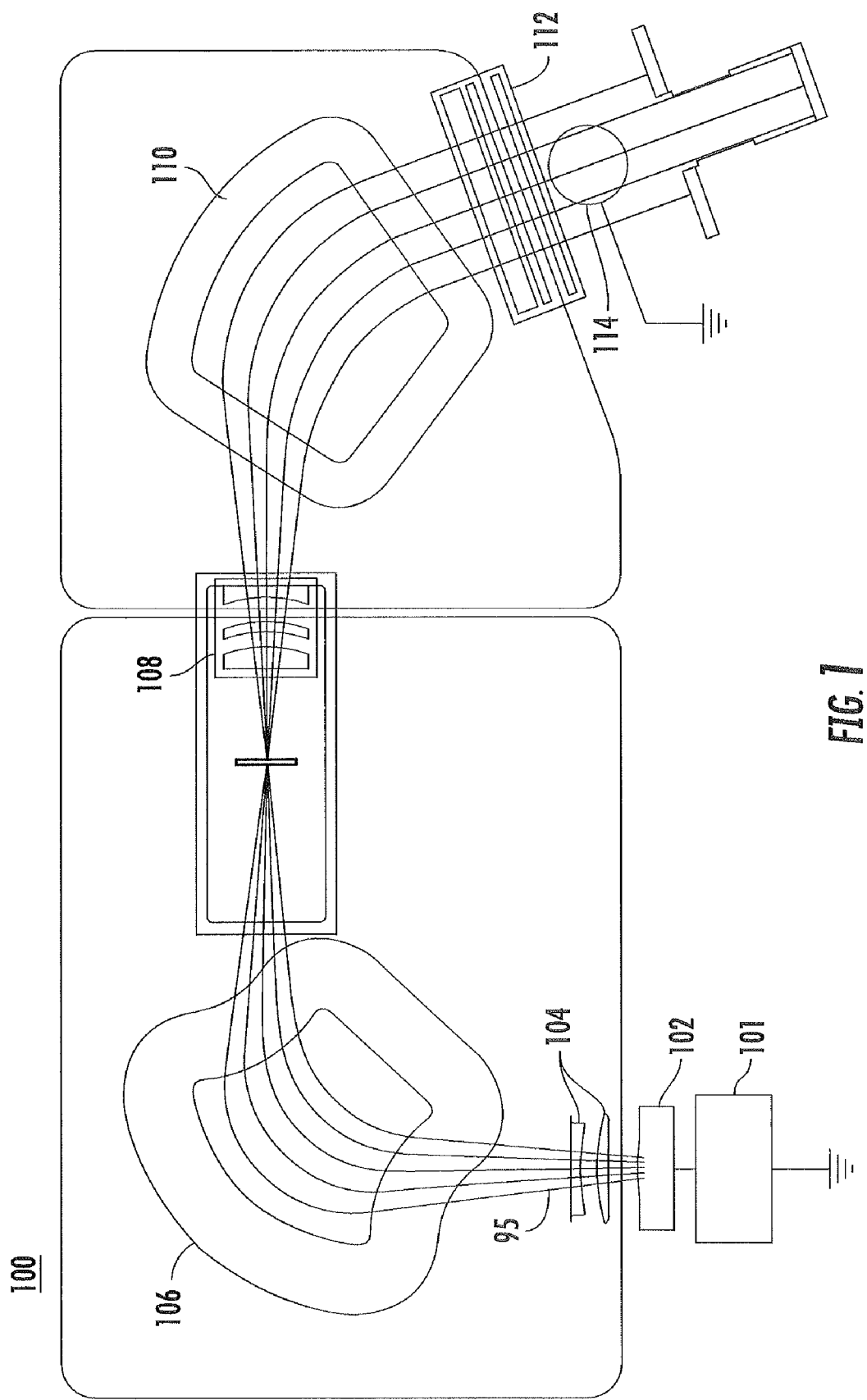
FIG. 1 is a block diagram an exemplary high current ion implanter tool in accordance with the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 is a block diagram of an exemplary high current ion implanter tool 100 that provides the necessary ion dosage levels with low energy to permit shallow implants into a work piece. Implanter 100 includes an ion source chamber 102 which typically includes a heated filament powered by power supply 101 to ionize the feed gas introduced into the chamber to form charged ions and electrons (plasma). The heating element may be, for example, an indirectly heated cathode. Different feed gases are supplied to the source chamber to generate ions having particular dopant characteristics. The ions are extracted from source chamber 102 via a standard three (3) extraction electrode configuration comprising a plasma or arc slit (integral with chamber 102), suppression and ground electrodes 104. These electrodes are used to create a desired electric field to focus ion beam 95 extracted from source chamber 102. Beam 95 passes through a mass analyzer chamber 106 having a magnet which functions to pass only ions having the desired charge-to-mass ratio to a resolving aperture. In particular, analyzer magnet includes a curved path where beam 95 is exposed to the applied magnetic field which causes ions having the undesired charge-to-mass ratio to be deflected away from the beam path. Deceleration stage 108 includes a plurality of electrodes which outputs a diverging ion beam. A corrector or collimator magnet chamber 110 is positioned downstream of deceleration stage 108 and is configured to deflect the ion beam 95 into a ribbon beam having parallel trajectories. A magnetic field may be used to adjust the deflection of the ions via a magnet coil. The ribbon beam is targeted toward a work piece which is attached to a support or platen 114. An additional deceleration stage 112 may also be utilized which is disposed between collimator magnet chamber 110 and support 114.

Figure 2:
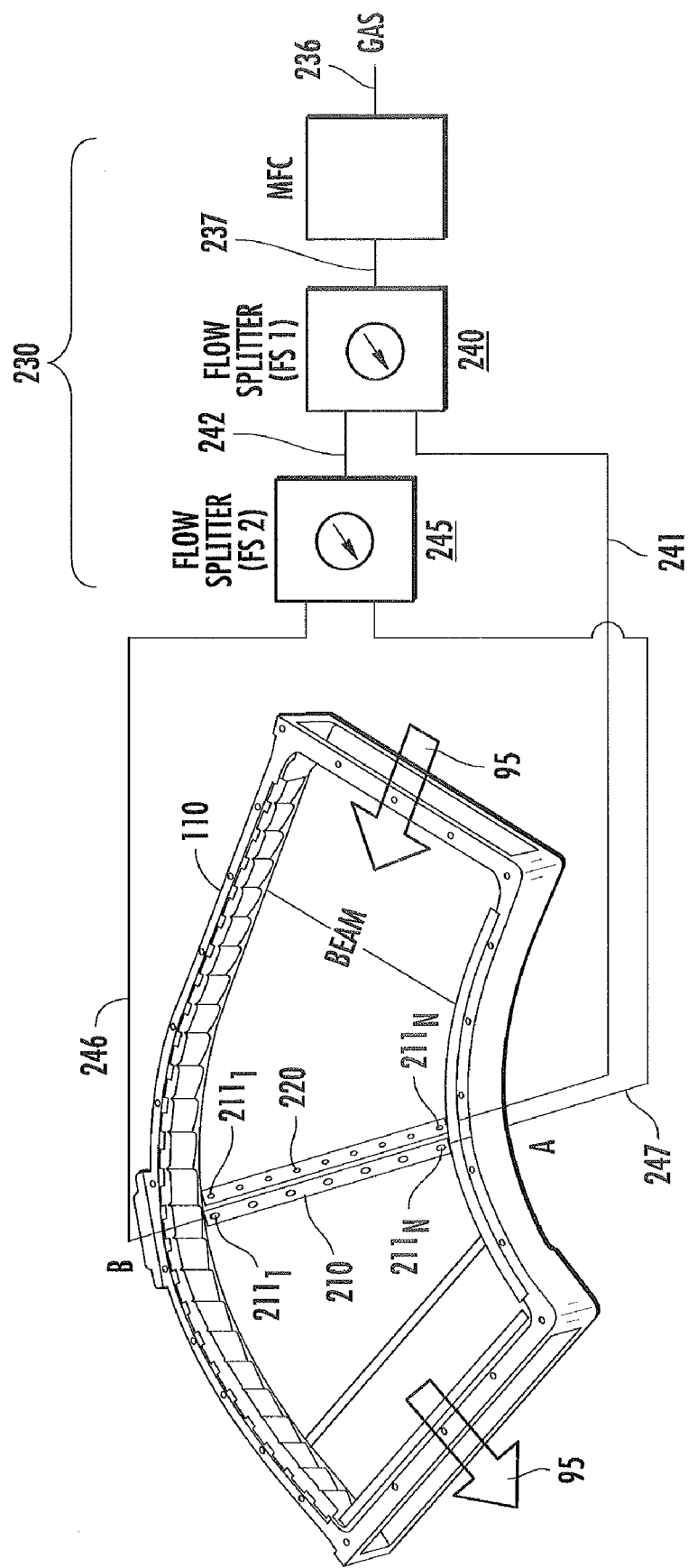
FIG. 2 is a perspective view of an exemplary collimator magnet of the ion implanter shown in FIG. 1 in accordance with an embodiment of the present invention.

FIG. 2 illustrates an exemplary configuration of collimator magnet chamber 110 of implanter 100 utilizing a gas bleed distribution across ion beam 95 in accordance with the present invention. As mentioned above, low energy ion beams have a tendency to "blow-up" via space charge effect, which means that like charged ions within the ion beam repel each other as the beam propagates through implanter 100. This repulsion causes the beam to diverge from its intended path toward the substrate positioned on support 114. This divergence is more problematic with beams having high current and low energy since the greater ion concentrations associated with high current beams increases the repulsion forces while the slower velocity of the low energy beam provides more time for the repulsion forces to act within the beam. The beam 95 is scanned onto the work piece in a direction that is perpendicular to the beam path. Collimator magnet chamber 110 is used to reorient the ion beam as it approaches the work piece such that the beam ions travel parallel to each other at the plane of the substrate or work piece.

Beam 95 propagates through collimator magnet at a pressure of, for example, 1E-5 Torr. Ion beam 95 is spatially neutralized by introducing a bleed gas into the collimator magnet chamber 110. In particular, collimator magnet chamber 110 is configured to include a differential bleed channel 210 and a uniform bleed channel 220. Each of these channels extend between points A and B across the lower surface 111 of collimator magnet chamber 110. Alternatively, the channels may also extend across the upper surface, combination of upper and lower surface or may also be configured along the inner and/or outer radius of the collimator magnet chamber 110. Differential channel 210 includes a plurality of holes $211_1$-$211_N$ spaced relatively equidistant from one another to provide non-uniform gas distribution to collimator magnet 110. Uniform channel 220 includes a plurality of smaller holes $221_1$-$221_N$ relative in size to holes $211_1$-$211_N$ of differential channel 210. Uniform channel holes $221_1$-$221_N$ are spaced relatively equidistant from each other and supply a uniform gas distribution to collimator magnet 110 through the smaller holes. Uniform channel 220 has a particular interior diameter (ID) which has a certain relationship to the diameter of holes $221_1$-$221_N$. For example, the diameter of holes $221_1$-$221_N$ may each be the same diameter while the ID of channel 220 may be changed to provide uniform bleed gas distribution. Channel 220 may have an ID of 0.25" where the diameter of each of holes is approximately 0.010". Differential channel 210 may include holes $211_1$-$211_N$ of differential channel 210 may be changed to accommodate a desired gas bleed distribution across beam 95. For example, holes $211_1$-$211_N$ may be spaced more closely together toward the inner radius of collimator chamber 110 and spaced further apart from each other at the outer radius of chamber 110. In addition, dual differential channels may be employed across chamber 110 where a first differential channel has holes spaced closely together toward the inner radius and a second differential channel having holes spaced closely together toward the outer radius of chamber 110. Various hole size and placements along one or more channels may be configured to provide the desired gas bleed distribution. Moreover, the size of the holes and the ID of each of the first and second channels may be different depending on the particular bleed gas distribution desired. In addition, certain of the holes either along differential channel 210 or 220 may be closed to only provide gas bleed distribution through a certain part or parts of the channel. This also results in localized distribution of bleed gas across only desired portions of beam 95. In this manner, bleed gas is supplied through differential channel 210 and/or uniform channel 220 in amounts and location(s) with respect to ion beam 95 which neutralizes the space charge effect. Although the present embodiment is described with equally spaced large or small holes, the principal of the invention may also be configured with small holes with non-equidistant spacing or with porous materials. Also, although the present embodiment is described with reference to the placement of differential channel 210 and uniform channel 220 in collimator magnet 110, these channels and the principles of the invention may also be configured with mass analyzer chamber 106 or within the ion extraction region (electrodes 104) proximate ion source 102.

A bleed gas supply assembly 230 includes a mass flow controller (MFC) 235 which controls the total amount of bleed gas to the collimator magnet chamber and a pair of cascaded flow splitters 240 and 245 which controls the distribution of the gas to the differential and uniform channels. A bleed gas is supplied to MFC 235 from a gas source via conduit 246. Exemplary bleed gases may include, for example, hydrogen, helium, nitrogen, oxygen, xenon, water vapor, sulfur hexafluoride and combinations thereof. MFC 235 provides pressurized gas to the input of first flow splitter 240 via conduit 237. First flow splitter 240 provides gas to uniform channel 220 via conduit 241. First flow splitter 240 also supplies gas to second flow splitter 245 via conduit 242. Second flow splitter 245 has two outputs which supply gas to differential channel 210 via conduits 246 and 247. Although flow splitters are illustrated as part of assembly 230, they may be replaced with control valves and or individual MFC units for each of the respective channels.

Figure 3A:
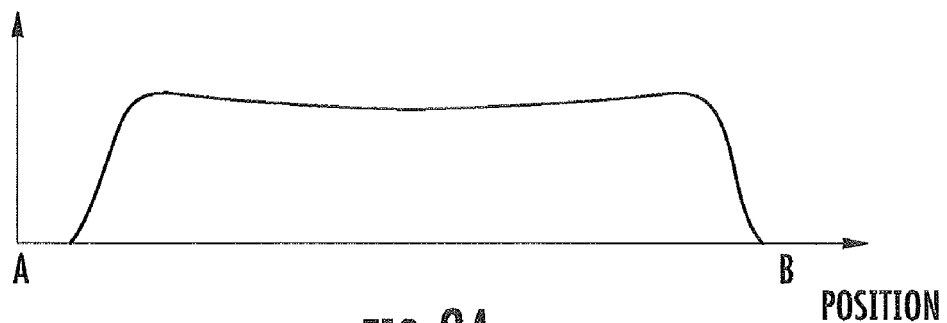
FIG. 3A illustrates an exemplary plot of a uniform beam current profile vs. beam position across the ribbon beam in accordance with an embodiment of the present invention.
Figure 3B:
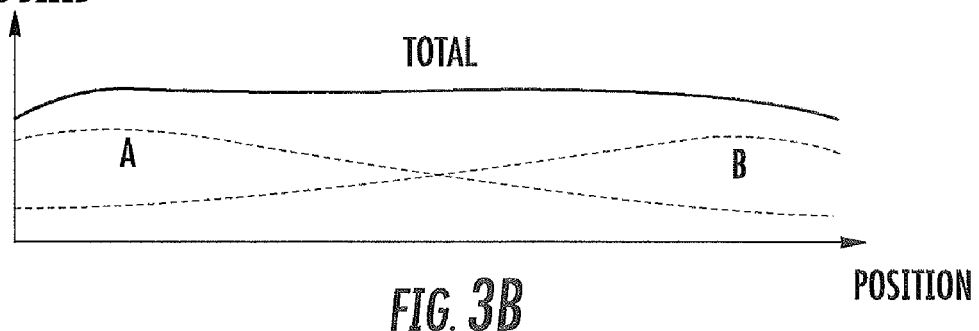
FIG. 3B illustrates an exemplary plot of a gas bleed distribution vs. beam position across the ribbon beam in accordance with an embodiment of the present invention.

Depending on the initial non-uniformity of the incoming ribbon beam 95 toward collimator magnet chamber 110, the differential and uniform channels 210, 220 may be tuned to optimize uniformity. For example, FIG. 3A illustrates a plot of the beam current density vs. position along the ribbon beam 95 from points A to B traveling through collimator magnet chamber 110 in the z-direction. In this case, the beam current profile is relatively uniform. To enhance the beam transport and therefore beam current for the uniform beam 95, a uniform gas pressure distribution may be supplied to uniform channel 220 via gas supply assembly 230. In particular, flow splitter 240 may be set to supply 100% of the gas from MFC 235 to uniform channel 220. As shown in FIG. 3B, this supplies bleed gas to uniform channel 220 having a substantially flat profile between points A and B across beam current 95. This is accomplished by providing a substantially uniform bleed gas pressure through conduit 241 to uniform channel 220. Alternatively, to supply a uniform bleed gas distribution across beam 95, flow splitter 240 may be set to supply 100% of the gas from MFC 235 to flow splitter 245 which then supplies the bleed gas to both ends of differential channel 210 from ends A and B. This configuration also provides a substantially uniform gas distribution as illustrated in the FIG. 3B to neutralize the space charge of beam 95 as it propagates through collimator magnet chamber 110. In addition, a feedback method may also be used to check the uniformity of beam 95 to further control the bleed gas distribution through the channels 210 and 220. In particular, beam 95 may be measured for uniformity as it exits collimator magnet chamber 110. This feed back is used to control how the bleed gas is distributed within the collimator magnet chamber 110.

Figure 4A:
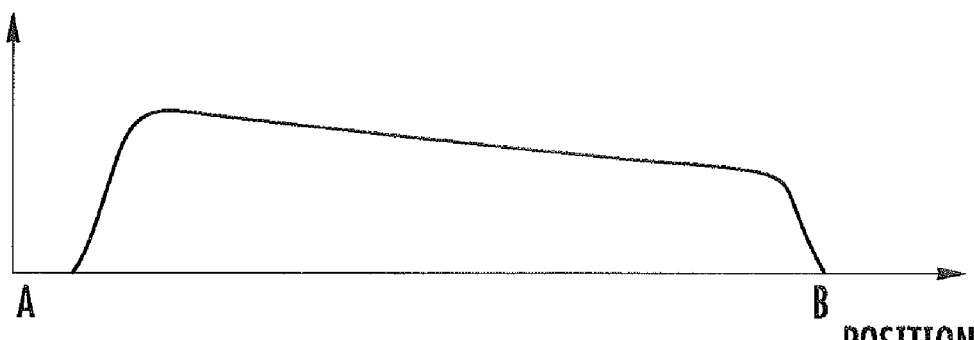
FIG. 4A illustrates an exemplary plot of a non-uniform beam current profile vs. beam position across the ribbon beam in accordance with an embodiment of the present invention.
Figure 4B:
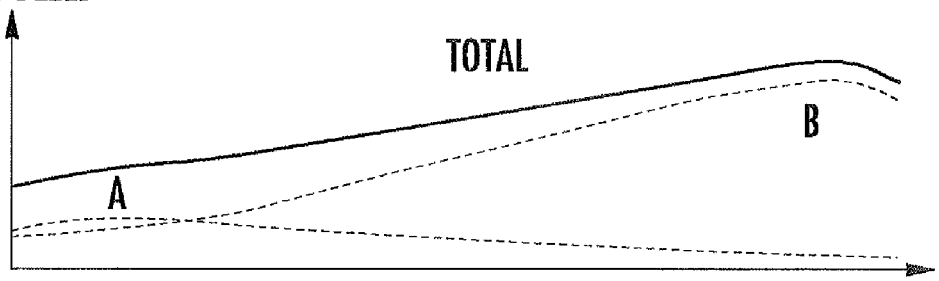
FIG. 4B illustrates an exemplary plot of a gas bleed distribution vs. beam position across the ribbon beam in accordance with an embodiment of the present invention.

FIG. 4A illustrates a plot of the beam current vs. position along ribbon beam 95 from points A to B traveling through collimator magnet chamber 110 in the z-direction. As can be seen, the beam current profile is relatively non-uniform across the beam position in that the beam current at position A has a greater magnitude than the beam current at position B. To enhance the beam transport and therefore beam current for the non-uniform beam 95, a non-uniform gas distribution may be supplied to differential channel 210 via gas supply assembly 230. In particular, the flow splitter 240 may be set to supply 100% of the gas from MFC 235 to flow splitter 245 which then supplies the bleed gas to differential channel 210. The amount and distribution of the bleed gas supplied to differential channel 210 via conduits 246 and 247 is shown in FIG. 4B. The total bleed gas supplied to differential channel 210 is greater toward beam position B as compared to beam position A. This is accomplished by adjusting the gas flow from splitter 245 to provide a greater bleed gas pressure through conduit 246 toward beam position B as it propagates through collimator chamber 110. The higher bleed gas pressure at position B neutralizes more space charge in the ribbon beam 95 at that location. This enhanced neutralization thereby increases the current density at that location which results in improved beam current uniformity. Alternatively, it has also been found that variations in the supply of bleed gas via assembly 230 may be configured to utilize both differential channel 210 and uniform channel 220 in varying amounts and pressures as long as the gas bleed profile controls the uniformity of the beam current across the ribbon beam 95. Thus, the configuration of the bleed holes across differential channel 210 and uniform channel 220 controls the gas bleed distribution across beam 95 as it propagates through collimator magnet chamber 110. In this manner, the space charge neutralization effect of the introduction of the bleed gas is maximized to control the ribbon beam uniformity.

Figure 5:
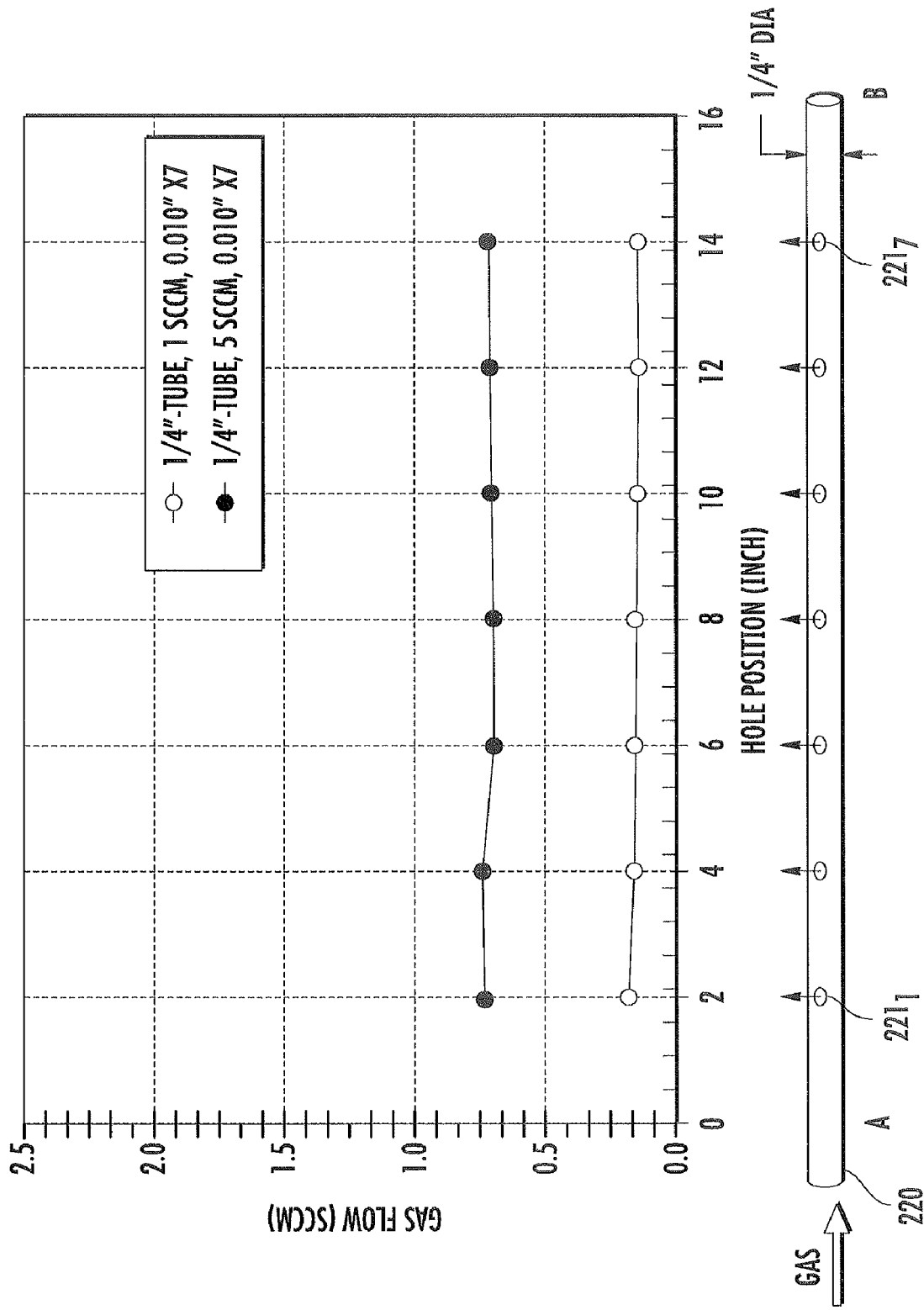
FIG. 5 is a perspective view of another exemplary collimator magnet chamber of the ion implanter shown in FIG. 1 having various configurations of the differential and uniform channels in accordance with an embodiment of the present invention.

FIG. 5 illustrates a distribution of bleed gas flow rate vs. hole position through the uniform channel 220. In this exemplary embodiment, channel 220 is ¼" in diameter with bleed hole $221_1$-$221_N$ spacing of approximately 2". Each hole $221_1$-$221_N$ may be, for example, 0.010" in diameter. As the plot shows, when gas is supplied into channel 220 at 1 sccm (standard cubic centimeter per minute), the resulting bleed gas that exits each of holes $221_1$-$221_7$ is approximately 0.2 sccm. Similarly, when gas is supplied into channel 220 at 5 sccm, the resulting bleed gas that exits each of holes $221_1$-$221_7$ is approximately 0.7 sccm. In this manner, by varying the pressure of gas supplied to channel 220, a uniform bleed gas flow distribution is supplied across beam 95 from position A to position B (as shown in FIG. 3).

Figure 6:
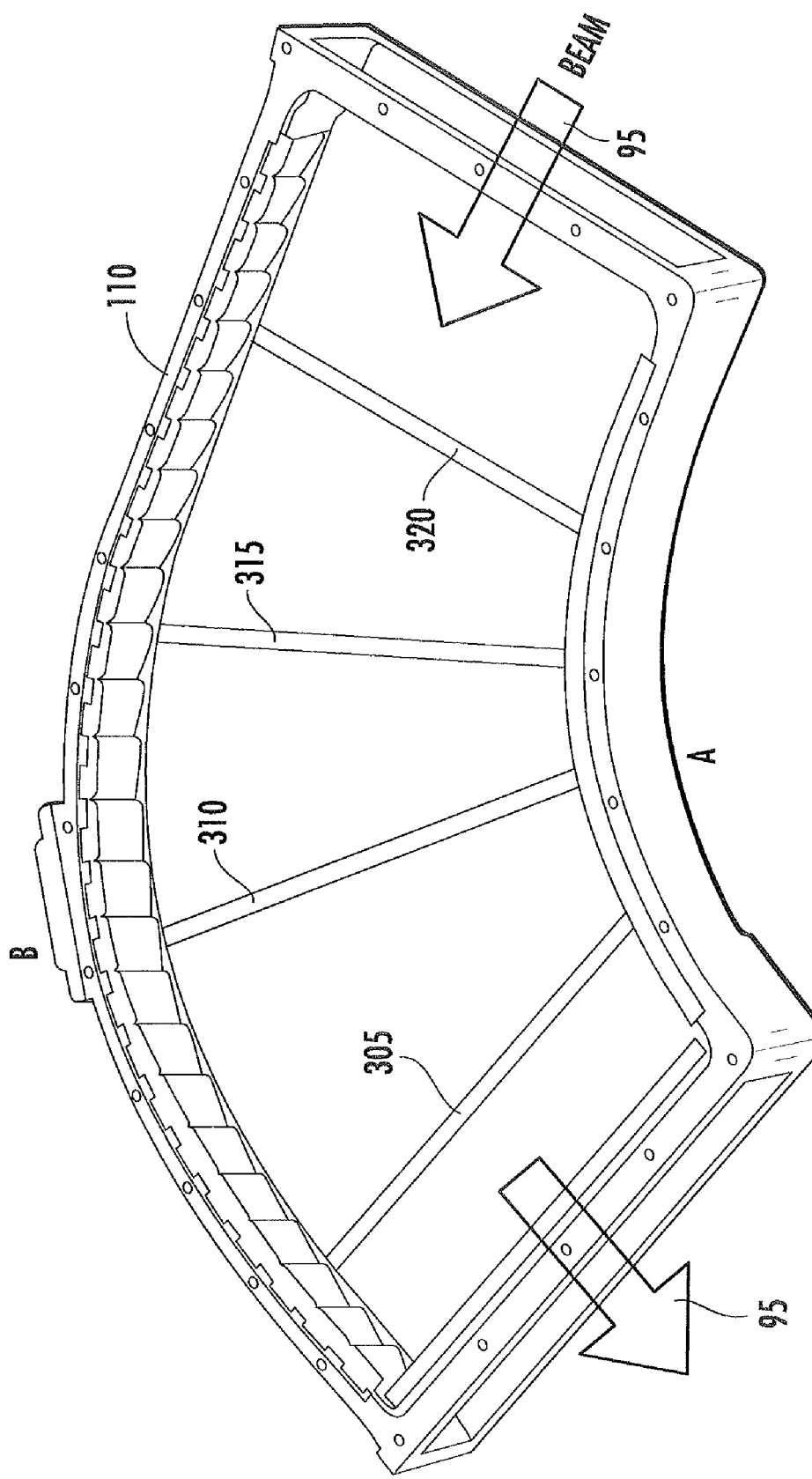
FIG. 6 is a perspective view of another exemplary collimator magnet chamber of the ion implanter shown in FIG. 1 having various configurations of the differential and uniform channels in accordance with an embodiment of the present invention.

FIG. 6 illustrates another embodiment of collimator chamber 110 with alternative uniform and differential channel configurations. The differential channel having bleed holes $211_1$-$211_N$ and uniform channel 220 having bleed holes $221_1$-$221_N$ described in FIG. 2 may be employed in the various configurations described in FIG. 6. In addition, bleed gas supply assembly 230 has been omitted for ease of explanation, however, each of the channels is supplied with a gas source similar to assembly 230 and as described with reference to FIG. 2. Collimator magnet chamber 110 is illustrated with a plurality of possible channel locations 305, 310, 315 and 320 which extend across the beam line from point A to B. For example, collimator magnet chamber 110 may be configured with a pair of uniform channels at beam locations 305 and 320 and a differential channel at beam location 310. Alternatively, collimator magnet 110 may include a uniform channel at beam location 320 and a differential channel at beam location 305. In addition, non-uniform gas bleed distribution may be provided by opening/closing the holes $211_1$-$211_N$ of differential channel 210 and/or holes $221_1$-$221_N$ of uniform channel 220 to control where the bleed gas enters the beam line and subsequent neutralization. In this manner, alternative channel configurations can be used to supply various gas bleed distributions across the beam line as beam 95 propagates through collimator magnet chamber 110, thereby supporting custom space charge neutralization schemes to control and maximize the ribbon beam uniformity.

Figure 7:
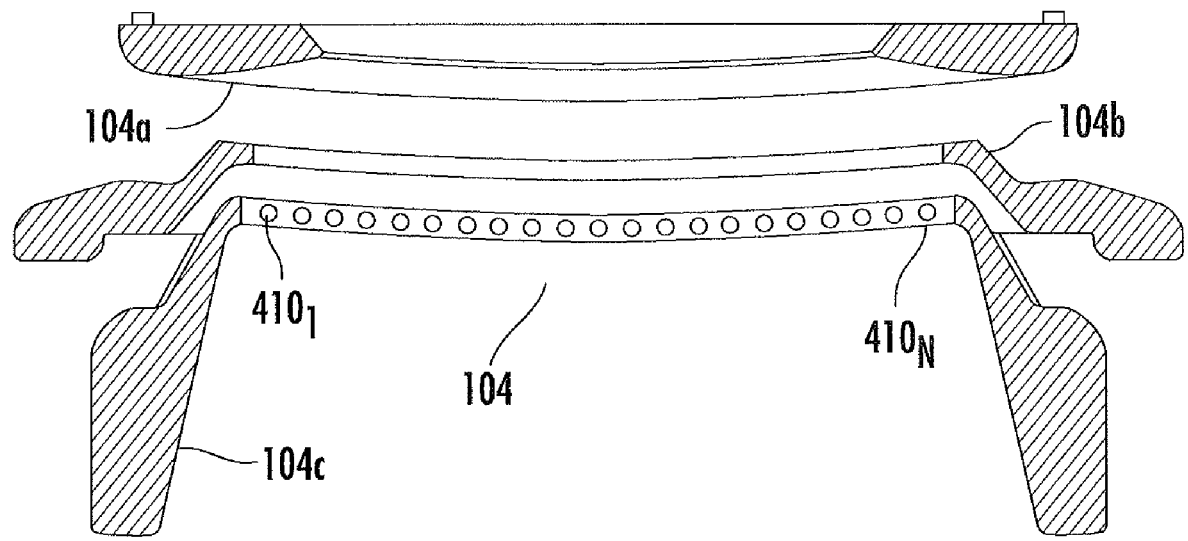
FIG. 7 is cut-away top plan view of an exemplary extraction electrode assembly employed as part of the ion implanter shown in FIG. 1 in accordance with an embodiment of the present invention.

FIG. 7 is cut-away top plan view of an exemplary extraction electrode assembly employed as part of system 100 and configured to correct current density non-uniformities in accordance with an embodiment of the present invention. Extraction electrode assembly 104 (as shown in FIG. 1) comprises a typical three (3) electrode configuration used to extract ion beam 95 for implantation into a work piece or substrate. Assembly 104 includes plasma or arc slit electrode 104a, suppression electrode 104b and ground electrode 104c. Plasma electrode 104a is disposed between suppression electrode 104a and ion source chamber 102. Suppression electrode 104b is typically biased at a moderate negative value to prevent electrons from entering back into source chamber 102 and to assist in focusing ion beam 95. Ground electrode 104c is positioned downstream from suppression electrode 104b and is at ground potential. Suppression electrode 104b and ground electrode 104c include slots which are aligned with a slot from the plasma electrode 104a for ion beam extraction. The strength of the electric field generated by the electrodes can be tuned to a desired beam current to extract a particular type of ion beam from ion source chamber 102. Ground electrode 104c includes a plurality of holes $410_1$ ... $410_N$ spaced along a portion of the electrode. Each of the holes $410_1$ ... $410_N$ is a product of channels disposed through the ground electrode. A bleed gas is supplied to one or more of the plurality of channels and exit the respective holes $410_1$ ... $410_N$ (similar to the bleed gas supply assembly 230 shown with reference to FIG. 2) to neutralize the space charge effect of beam 95 as it propagates through electrode assembly 104. In particular, holes $410_1$ ... $410_N$ provide highly directional and localized introduction of gas beams into the extraction region. The shape of the gas beams can be controlled by varying the channel width to length ratios and thereby the size of the holes $410_1$ ... $410_N$. Each of the channels may be, for example, at least ten (10) times greater in length than its diameter. In addition, each hole may be controlled individually which enables tuning of undesired beam current density variations of beam 95 in the extraction region of implanter 100. Although FIG. 7 illustrates that the holes $410_1$ ... $410_N$ are located in the ground electrode 104c, it is also contemplated that the holes $410_1$ ... $410_N$ may be located in either one of the plasma or arc slit electrode 104a and suppression electrode 104b or both of the plasma or arc slit electrode 104a and suppression electrode 104b. It is also contemplated that the holes are located in each one of the plasma or arc slit electrode 104*a*, suppression electrode 104*b*, and ground electrode 104*c*.

Figure 8:
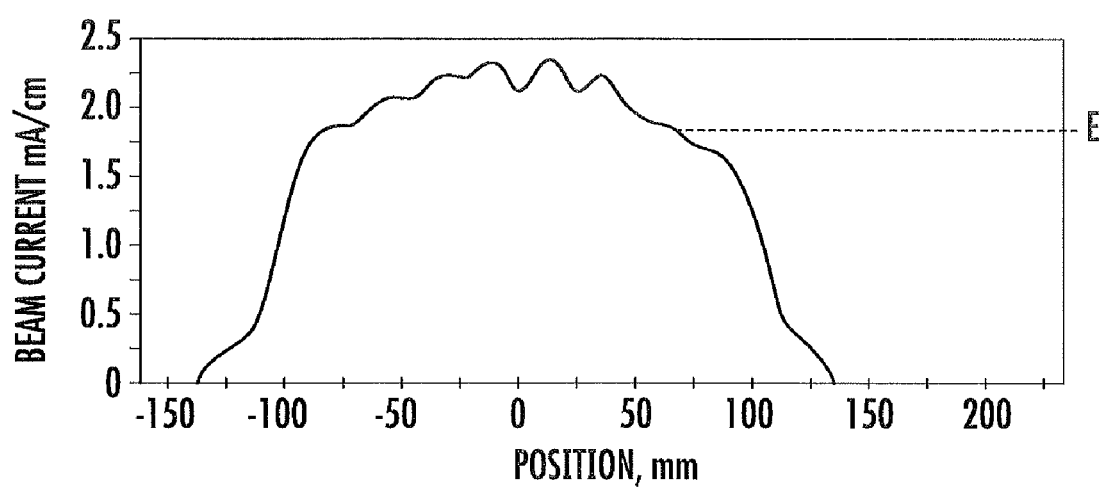
FIG. 8 is a graph illustrating ribbon beam profile generated from an ion source chamber.

In operation, the extraction electrode assembly may supply various gas bleed distributions across the beam as the beam propagates through the assembly, thereby supporting custom space charge neutralization schemes to control and maximize the beam uniformity. In addition, the assembly may minimize the local beam non-uniformity or beam wiggles that may be caused by oscillation of the plasma in the ion source. Referring to FIG. 8, the ion beam exiting the ion source may have local nonuniformity or wiggles near the peak. Presence of such wiggles may be undesirable as the wiggles may also contribute to the beam non-uniformity and non-uniform implantation of the workpiece. By controlling the gas bleed distributions across the beam as the beam propagates through the assembly, the assembly may minimize the wiggles and the beam may have more flat profile near the peak.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. An ion implantation system comprising:
    an ion source configured to receive a dopant gas and generate ions having a particular energy and mass, said ion source having an aperture through which said ions are extracted;
    a work piece positioned downstream of said ion source for receiving said extracted ions in the form of an ion beam;
    a bleed gas channel disposed between said ion source and said work piece, said bleed gas channel having a plurality of holes for distributing said bleed gas across at least a portion of said ion beam wherein said bleed gas channel is a differential channel configured to distribute said bleed gas substantially non-uniformly across said ion beam via one or more of said plurality of holes; and
    a magnet disposed between said ion source and said work piece, said bleed gas channel disposed within said magnet.

2. The ion implantation system of claim 1 wherein said magnet comprises a mass analyzer magnet configured to analyze said beam and allow ions having a desired mass-to-charge ratio to propagate through said analyzer magnet, said bleed gas channel disposed within said mass analyzer magnet.

3. The ion implantation system of claim 1 further comprising an extraction assembly proximate said ion source, said extraction assembly having a plurality of electrodes configured to extract ions from said ion source, and another bleed gas channel disposed within said extraction assembly.

4. The ion implantation system of claim 1 wherein said magnet comprises a collimator magnet configured to receive said ion beam and reorient the beam toward said work piece, said bleed gas channel disposed within said collimator magnet.

5. The ion implantation system of claim 1 wherein said bleed gas channel further comprises a uniform channel configured to distribute said bleed gas substantially uniformly across said ion beam.

6. The ion implantation system of claim 1 wherein said ion beam has a current density based on position within said beam, said bleed gas is distributed non-uniformly via one or more of said plurality of holes of said differential channel such that said non-uniformity of said current density of said ion beam is offset.

7. The ion implantation system of claim 1 wherein said plurality of holes are spaced equidistant from one another along said differential channel.

8. The ion implantation system of claim 1 wherein said channel further comprises a uniform channel having a plurality of holes for distributing said bleed gas across said ion beam.

9. The ion implantation system of claim 1 further comprising a gas supply assembly connected to said channel for supplying said bleed gas to said channel.

10. The ion implantation system of claim 9 wherein said gas supply assembly further comprises a gas source for supplying said bleed gas and a conduit disposed between said gas source and said channel.

11. The ion implantation system of claim 10 wherein said gas supply assembly further comprising:
    a mass flow controller connected to said gas source;
    a flow splitter disposed between said mass flow controller and said channel, said flow splitter directing a predetermined amount of gas from said gas source to said channel.

12. The ion implantation system of claim 9 wherein said gas supply assembly further comprises:
    a gas source for supplying said bleed gas;
    a mass flow controller connected to said gas source via a first conduit;
    a flow splitter having an input connected to said mass flow controller via a second conduit, said flow splitter having a first output connected to a uniform channel via a third conduit and a second output connected to said differential channel via a fourth conduit.

13. The ion implantation system of claim 9 wherein said gas supply assembly further comprises:
    a gas source for supplying said bleed gas;
    a mass flow controller connected to said gas source via a first conduit;
    a first flow splitter having an input connected to said mass flow controller via a second conduit, said flow splitter having a first output connected to a uniform channel via a third conduit, said first flow splitter controlling the flow of bleed gas to said uniform channel;
    a second flow splitter having an input connected to a second output of said first flow splitter via a fourth conduit, said second flow splitter having a first output connected to a first end of said differential channel via a fifth conduit and a second output connected to a second end of said differential channel via a sixth conduit, said second flow splitter controlling the flow of bleed gas to said differential channel.

14. The ion implantation system of claim 1 further comprising a feedback loop assembly disposed downstream from said bleed gas channel and upstream from said work piece, said feedback loop assembly configured to measure the uniformity of said ion beam.

15. The ion implantation system of claim 14 wherein said feedback loop assembly is configured to control the bleed gas distribution through said channel.

16. An ion implantation system comprising:
    an ion source configured to receive a dopant gas and generate ions having a particular energy and mass, said ion source having an aperture through which said ions are extracted;

a work piece positioned downstream of said ion source for receiving said extracted ions in the form of an ion beam;

a ground electrode disposed downstream from said ion source between said ion source and said work piece; and at least one bleed gas channel disposed through said ground electrode, wherein said bleed gas channel has a plurality of holes and wherein said bleed gas channel is a differential channel configured to distribute said bleed gas substantially non-uniformly across said ion beam via one or more of said plurality of holes.

17. The ion implantation system of claim 16 wherein said ground electrode has a length which is perpendicular to the path of said ion beam, said bleed gas channel is a first bleed gas channel of a plurality of channels disposed through said ground electrode, each of said plurality of channels spaced along said length of said ground electrode corresponding to a position across said ion beam.

18. The ion implantation system of claim 17 wherein said ion beam has an associated current density, said bleed gas is supplied to one or more of said plurality of channels of said ground electrode such that said current density of said ion beam is offset.

* * * * *